(12) United States Patent
Teramae

(10) Patent No.: US 9,041,052 B2
(45) Date of Patent: May 26, 2015

(54) SEMICONDUCTOR DEVICE, SEMICONDUCTOR UNIT, AND POWER SEMICONDUCTOR DEVICE

(75) Inventor: Satoshi Teramae, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 722 days.

(21) Appl. No.: 13/052,025

(22) Filed: Mar. 18, 2011

(65) Prior Publication Data

US 2011/0284924 A1    Nov. 24, 2011

(30) Foreign Application Priority Data

May 21, 2010  (JP) .................................. 2010-117219

(51) Int. Cl.
*H01L 27/12* (2006.01)
*H01L 25/07* (2006.01)
(Continued)

(52) U.S. Cl.
CPC ............... *H01L 25/072* (2013.01); *H01L 23/04* (2013.01); *H01L 23/049* (2013.01); *H01L 23/24* (2013.01); *H01L 23/3735* (2013.01); *H01L 23/49838* (2013.01); *H01L 24/29* (2013.01); *H01L 24/32* (2013.01); *H01L 2224/32238* (2013.01); *H01L 2224/83447* (2013.01); *H01L 2224/83801* (2013.01); *H01L 2924/01013* (2013.01); *H01L 2924/01029* (2013.01); *H01L 2924/01033* (2013.01); *H01L 2924/13055* (2013.01); *H01L 2924/19107* (2013.01); *H01L 2924/351* (2013.01); *H01L 2924/01005* (2013.01); *H01L 2924/01006* (2013.01); *H01L 2924/01023* (2013.01); *H01L 2924/01074* (2013.01); *H01L 2924/01322* (2013.01); *H01L 2924/014* (2013.01); *H01L 2224/29101* (2013.01);
(Continued)

(58) Field of Classification Search
CPC ..................... H01L 23/3735; H01L 23/49838; H01L 24/29; H01L 24/32; H01L 25/072
USPC .................. 257/506, 724, E27.112, E29.197, 257/133–141
See application file for complete search history.

(56) References Cited

U.S. PATENT DOCUMENTS 5,604,674 A * 2/1997 Terasawa ...................... 363/147
6,236,110 B1 * 5/2001 Muto et al. .................... 257/724
(Continued)

FOREIGN PATENT DOCUMENTS

CN      101681907 A     3/2010
JP      07249734 A  *  9/1995 ............. H01L 25/07
(Continued)

OTHER PUBLICATIONS

Japanese Office Action dated Jun. 19, 2013, filed in Japanese counterpart Application No. 2010-117219, 7 pages (with translation).
(Continued)

*Primary Examiner* — Daniel Shook
(74) *Attorney, Agent, or Firm* — Patterson & Sheridan, LLP

(57) ABSTRACT

A semiconductor device includes: an insulating substrate; a first electrode pattern and a second electrode pattern provided apart from each other on a major surface of the insulating substrate; a semiconductor element connected to the first electrode pattern; an electrode terminal connected to the second electrode pattern; and a connection wiring. The connection wiring electrically connects the first electrode pattern and the second electrode pattern with each other and has a thermal resistance larger than that of the first electrode pattern.

19 Claims, 12 Drawing Sheets

(51) Int. Cl.
*H01L 23/373* (2006.01)
*H01L 23/498* (2006.01)
*H01L 23/00* (2006.01)
*H05K 1/02* (2006.01)
H01L 23/04 (2006.01)
H01L 23/049 (2006.01)
H01L 23/24 (2006.01)
H05K 3/00 (2006.01)
H05K 3/22 (2006.01)

(52) U.S. Cl.
CPC ....... *H01L2224/32013* (2013.01); *H01L 24/45* (2013.01); *H01L 2224/45124* (2013.01); *H05K 1/0209* (2013.01); *H05K 3/0061* (2013.01); *H05K 3/222* (2013.01); *H05K 2201/09663* (2013.01); *H05K 2201/0969* (2013.01); *H05K 2201/1028* (2013.01); *H05K 2201/10287* (2013.01)

(56) References Cited

U.S. PATENT DOCUMENTS

| | | | | |
|---|---|---|---|---|
| 7,778,054 B2* | 8/2010 | Sasaya et al. | ............... | 363/56.01 |
| 2003/0001438 A1* | 1/2003 | Nii et al. | ....................... | 307/147 |
| 2008/0258316 A1 | 10/2008 | Tamba et al. | | |

FOREIGN PATENT DOCUMENTS

| | | |
|---|---|---|
| JP | 07249734 A | 9/1995 |
| JP | 11-026666 | 1/1999 |
| JP | H11-026666 A | 1/1999 |
| JP | 11-274398 | 10/1999 |
| JP | 2007-073782 | 3/2007 |
| JP | 2008124176 A | 5/2008 |
| JP | 2010-045399 | 2/2010 |
| WO | 0068992 A1 | 11/2000 |

OTHER PUBLICATIONS

Chinese Office Action dated Feb. 16, 2013, filed in Chinese counterpart Application No. 2011-10105633.5, 6 pages (with English translation).

Japanese Office Action dated Oct. 17, 2013, filed in Japanese counterpart Application No. 2010-117219, 5 pages (with translation).

Chinese Office Action dated Jan. 10, 2014, filed in Chinese counterpart Application No. 201110105633.5, 12 pages (with translation).

Chinese Office Action dated Jun. 3, 2014, filed in Chinese counterpart Application No. 201110105633.5, 15 pages (with translation).

Chinese Office Action dated Oct. 31, 2014, filed in Chinese counterpart Application No. 201110105633.5, 9 pages (with translation).

* cited by examiner

SEMICONDUCTOR DEVICE, SEMICONDUCTOR UNIT, AND POWER SEMICONDUCTOR DEVICE

CROSS-REFERENCE TO RELATED APPLICATIONS

This application is based upon and claims the benefit of priority from the prior Japanese Patent Application No. 2010-117219, filed on May 21, 2010; the entire contents of which are incorporated herein by reference.

FIELD

Embodiments described herein relate generally to semiconductor device, semiconductor unit, and power semiconductor device.

BACKGROUND

As a solder material which connects a semiconductor element to an electrode pattern electrically and mechanically, there is used a material which has a higher melting point than the operating temperature of the semiconductor element in order to minimally suppress a thermal influence from the semiconductor element which is a heating element.

In the semiconductor device, other members except for the semiconductor element, such as an electrode terminal which is conductively connected to the semiconductor element are provided on a substrate. For example, the electrode terminal is provided so as to be connected to the substrate within a package on one end and extended to the outside of the package on the other end (e.g., refer to Japanese Patent Application Laid-Open Publication JP-A 11-26666(Kokai)).

Here, while the semiconductor element is connected to the electrode pattern with a solder having a high melting point (high melting-point solder), the electrode terminal Is connected with a eutectic solder, for example, having a lower melting point than the solder connecting the semiconductor element for easy assembling. In this structure, when a higher temperature operation is tried to be realized in the semiconductor element, the solder connecting the electrode terminal is affected by the heat from the semiconductor element. The low melting-point solder is likely to become fragile because of this thermal influence, and the application of a load such as a stress to the solder causes degradation of the connection reliability of the member.

DETAILED DESCRIPTION

Figure 1A:
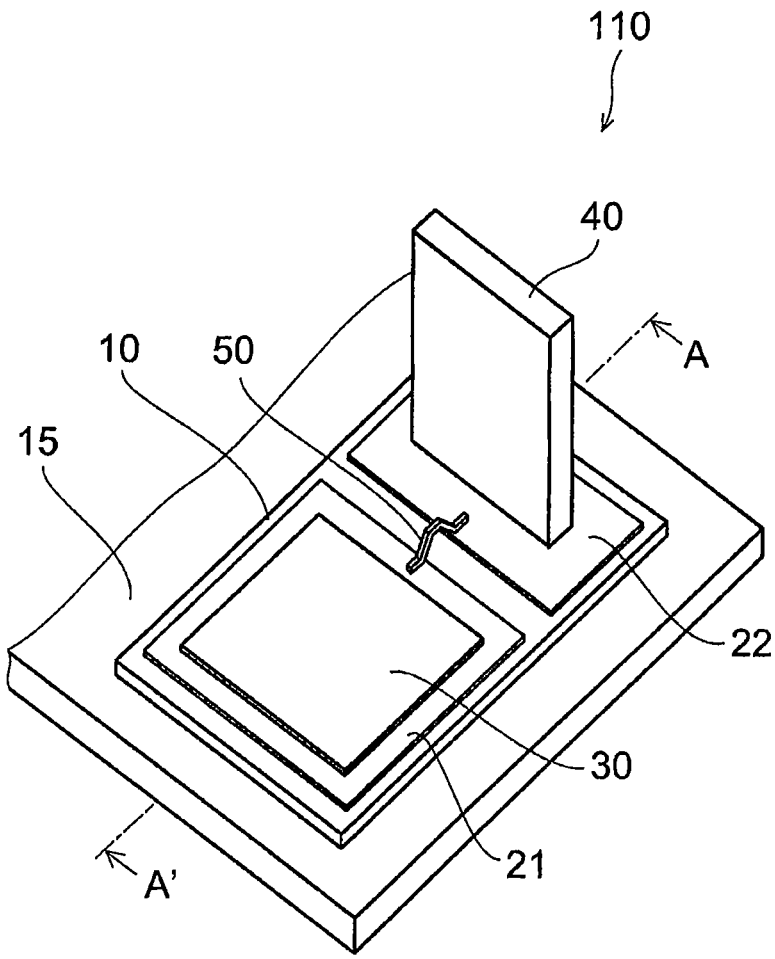
FIGS. 1A and 1B are exemplary diagrams explaining a semiconductor device according to a first embodiment.

In general, according to one embodiment, a semiconductor device includes: an insulating substrate; a first electrode pattern and a second electrode pattern provided apart from each other on a major surface of the insulating substrate; a semiconductor element connected to the first electrode pattern; an electrode terminal connected to the second electrode pattern; and a connection wiring. The connection wiring electrically connects the first electrode pattern and the second electrode pattern with each other and has a thermal resistance larger than that of the first electrode pattern.

According to another embodiment, a semiconductor device includes: a first insulating substrate; a second insulating substrate provided apart from the first insulating substrate; a first electrode pattern provided on a major surface of the first insulating substrate; a second electrode pattern provided on a major surface of the second insulating substrate; a first semiconductor element connected to the first electrode pattern; and a second semiconductor element. The second semiconductor element is connected to the second electrode pattern and has an operation period which overlaps with an operation period of the first semiconductor element at least in a part thereof.

According to another embodiment, a semiconductor unit includes: a semiconductor device including: an insulating substrate; a first electrode pattern and a second electrode pattern provided apart from each other on a major surface of the insulating substrate; a semiconductor element connected to the first electrode pattern; an electrode terminal connected to the second electrode pattern; and a connection wiring electrically connecting the first electrode pattern and the second electrode pattern with each other and having a thermal resistance larger than that of the first electrode pattern; and a package accommodating at least the semiconductor element, the connection wiring, and a part of the electrode terminal, therein.

According to another embodiment, a power semiconductor device includes; an insulating substrate; a first electrode pattern and a second electrode pattern provided apart from each other on a major surface of the insulating substrate; a power semiconductor element connected to the first electrode pattern; an electrode terminal connected to the second electrode pattern; and a connection wiring electrically connecting the first electrode pattern and the second electrode pattern with each other and having a thermal resistance larger than a thermal resistance of the first electrode pattern.

Hereinafter, embodiments of the invention will be explained according to the drawings.

Note that the drawing is exemplary or conceptual and a relationship between the thickness and the width of each part, a proportionality coefficient of a size between the parts, and the like are not always the same as those in an actual case. Furthermore, even when the same part is shown, the size and the proportionality coefficient are sometimes shown differently depending on the drawing.

Moreover, in this specification and each of the drawings, an element similar to that described previously with respect to a previously shown drawing is denoted by the same symbol and detailed explanation will be omitted optionally.

First Embodiment

Figure 1B:
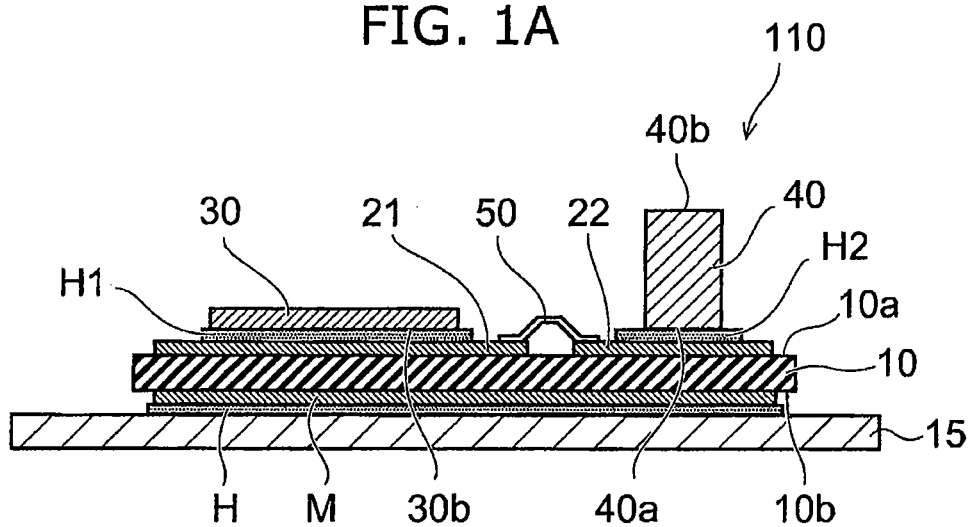

FIGS. 1A and 1B are exemplary diagrams explaining a semiconductor device according to a first embodiment.

FIG. 1A is an exemplary perspective view of the semiconductor device 110 according to the embodiment, and FIG. 1B is an exemplary cross-sectional view taken along the A-A' line shown in FIG. 1A.

The semiconductor device 110 is provided with an insulating substrate 10, a first electrode pattern 21, a second electrode pattern 22, a semiconductor element 30, an electrode terminal 40, and a connection wiring 50.

A ceramics substrate is used as the insulating substrate 10, for example. The insulating substrate 10 is connected to a base plate 15, for example. The base plate 15 is a metal plate made of Cu (copper), for example, and is utilized as a plate for fixing the semiconductor device 110 and also as a heat dissipation plate. A second major surface 10b of the insulating substrate 10 is provided with a metal film M. This metal film M and the base plate 15 are connected with each other with a solder H.

A first major surface 10a of the insulating plate 10 is provided with the first electrode pattern 21 and the second electrode pattern 22. The first electrode pattern 21 and the second electrode pattern 22 are provided apart from each other on the first major surface 10a of the insulating substrate 10.

The semiconductor element 30 is connected to a first electrode pattern 21. The semiconductor element 30 has a shape of a chip cut out from a semiconductor substrate. The semiconductor element 30 includes an active element such as a transistor and a diode, and additionally also includes a non-active element such as a resistor and a condenser. The semiconductor element 30 is treated as a heating element generating heat by current application and operation. The rear surface 30b of the semiconductor element 30 is connected to the first electrode pattern 21 with a solder H1. With the solder H1 (first connection member), the semiconductor device 30 is connected to the first electrode pattern 21 electrically and mechanically.

The electrode terminal 40 is connected to the second electrode pattern 22. The electrode terminal 40 is provided so as to be connected to the second electrode pattern 22 at one end 40a and so as to be extended to the outside of a package which is not shown in the drawing on the other end 40b. While one electrode terminal 40 is illustrated in FIGS. 1A and 1B, a plurality of electrode terminals 40 may be provided as needed. The one end 40a of the electrode terminal 40 is connected to the second electrode pattern 22 with a solder H2 (second connection member).

The connection wiring 50 is a metal wiring electrically connecting the first electrode patter 21 and the second electrode pattern 22 with each other. A bonding wire is used for the connection wiring 50, for example. While one connection wiring 50 is illustrated in FIGS. 1A and 1B, a plurality of connection wirings 50 may be provided as needed.

The connection wiring 50 has a larger thermal resistance than the thermal resistance of the first electrode pattern 21.

Here, the thermal resistance means a temperature rise amount by a generated heat amount per unit time. That is, the thermal resistance is a value representing difficulty in temperature conduction and a larger value means that it is more difficult to conduct heat.

In the semiconductor device 110, the first electrode pattern 21 and the second electrode pattern 22 are provided apart from each other. As a result, heat is not conducted directly from the first electrode pattern 21 to the second electrode pattern 22. The heat of the first electrode pattern 21 is conducted to the second electrode pattern 22 via the connection wiring 50. Accordingly, the heat of the first electrode pattern 21 is configured to be conducted to the second electrode pattern 22 via the thermal resistance of the connection wiring 50. As a result, in comparison with a case in which the first electrode pattern 21 and the second electrode pattern 22 are connected directly with each other, the heat conduction is suppressed by the heat resistance of the connection wiring 50.

Here, Cu (copper) is used for the first electrode pattern and the second electrode pattern 22, for example, Furthermore, Al (aluminum) is used for the connection wiring 50, for example. As a result, the connection wiring 50 provided between the first electrode pattern 21 and the second electrode pattern 22 provides the heat resistance of a heat conduction path from the first electrode pattern 21 to the second electrode pattern 22. Accordingly, the heat conduction is suppressed between the first electrode pattern 21 and the second electrode pattern 22.

Reference Example

Figure 2A:
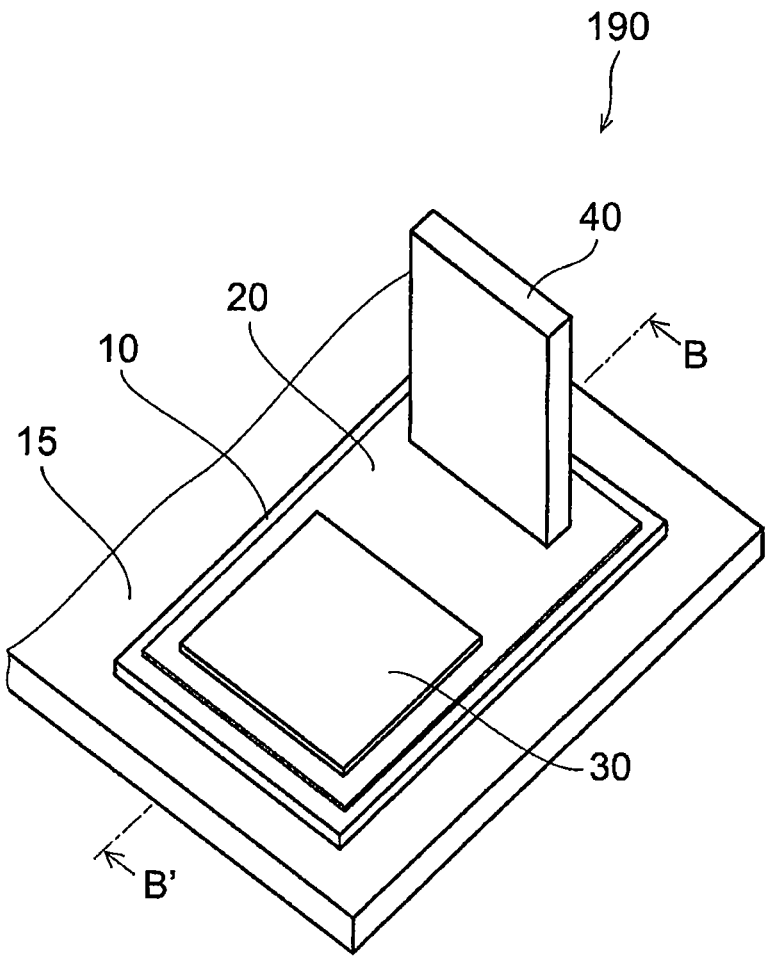
FIGS. 2A and 2B are exemplary diagrams explaining a semiconductor device according to a reference example.
Figure 2B:
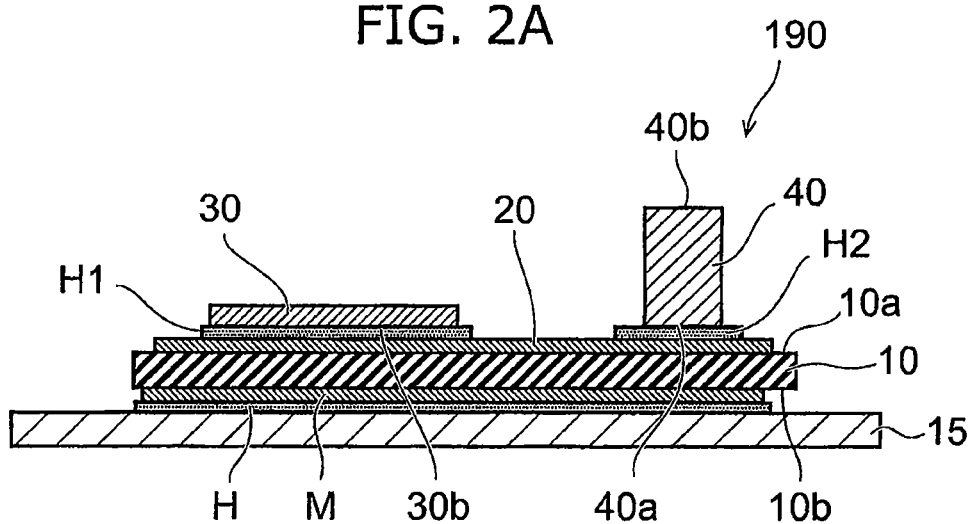

FIGS. 2A and 2B are exemplary diagrams explaining a semiconductor device according to a reference example.

FIG. 2A is an exemplary perspective view of the semiconductor device 190 according to the reference example, and FIG. 2A is an exemplary cross-sectional view taken along the B-B' line shown in FIG. 2A.

The semiconductor device 190 is provided with an insulating substrate 10, an electrode pattern 20, a semiconductor element 30, an electrode terminal 40, and a connection wiring 50.

That is, in the semiconductor device 190, the electrode pattern 20 is provided integrally on a first major surface 10a of the insulating substrate 10.

The rear surface 30b of the semiconductor element 30 is connected to the electrode pattern 20 with a solder H1. Furthermore, one end 40a of the electrode terminal 40 is connected to the electrode pattern 20 with a solder H2. That is, each of the semiconductor element 30 and the electrode terminal 40 is connected to the same electrode pattern 20.

In the semiconductor device 190 according to the reference example, the heat generated in the semiconductor element 30, which is a heating element, is conducted to the side of the electrode terminal 40 via the electrode pattern 20. That is, the heat generated in the semiconductor element 30 is conducted directly to the side of the electrode terminal 40 via the electrode pattern 20.

In contrast to this, in the semiconductor device 110 according to the embodiment, the first electrode pattern 21 connected with the semiconductor element 30 and the second electrode pattern 22 connected with the electrode terminal 40 are provided apart from each other. Accordingly, the heat generated in the semiconductor element 30 is not conducted directly to the side of the electrode terminal 40 via the first electrode pattern 21.

Here, the solder H1 used for the connection of the semiconductor element 30 has a higher melting point than the operation temperature of the semiconductor element 30. For example, in an IGBT (insulated Gate Bipolar Transistor) which is an example of the semiconductor element 30, the operating temperature (Tj: junction temperature) sometimes reaches approximately 150° C. As the solder H1, there is used a high melting-point solder having a melting point of approximately 300° C., for example, which is higher than the operating temperature Tj.

In contrast, as the solder H2 connecting the electrode terminal 40, there is used a eutectic solder having a melting point of 183° C., for example, which is lower than that of the solder H1 from the viewpoint of easy assembling.

In the semiconductor device 190 according to the reference example, the heat generated in the semiconductor element 30 is conducted directly to the side of the electrode terminal 40 via the electrode pattern 20. Accordingly, when the semiconductor element 30 is operated at the operating temperature Tj, this heat is conducted directly to the side of the electrode terminal 40 via the electrode pattern 20. The melting point of the solder H2 connecting the electrode terminal 40 is close to the operating temperature Tj of the semiconductor element 30. As a result, the solder H2 easily becomes fragile by receiving the influence of the heat conducted via the electrode pattern 20.

The electrode terminal 40 is connected with an outside wiring (not shown in the drawing) and tends to receive stress from the outside wiring. Accordingly, the solder H2 is caused to become fragile, and the peeling or the like of the solder H2 occurs easily when the stress from the outside wiring is applied to the solder H2. As a result, the connection reliability between the electrode terminal 40 and the electrode pattern 20 is affected.

In contrast to this, in the semiconductor device 110 according to the embodiment, the heat generated in the semiconductor element 30 is not conducted directly to the side of the electrode terminal 40 via the first electrode pattern 21. Accordingly, even when the semiconductor element 30 is operated at the operating temperature Tj, the solder H2 on the side of the electrode terminal 40 is not affected directly by the heat from the semiconductor element 30. As a result, embrittlement of the solder H2 is suppressed by the influence of the heat from the semiconductor element 30. Since embrittlement of the solder H2 is suppressed, the degradation of the connection reliability between the electrode terminal 40 and the second electrode pattern 22 is prevented.

Another Example of the First Embodiment

Figure 3A:
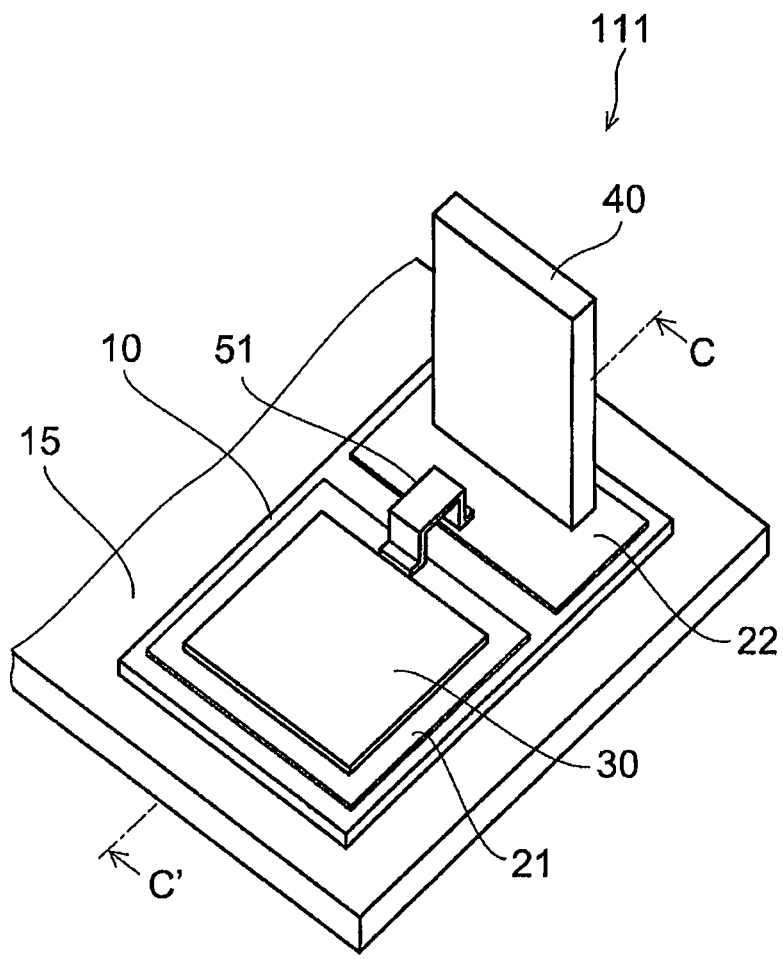
FIGS. 3A and 3B are exemplary diagrams explaining a semiconductor device according to another example of the first embodiment.
Figure 3B:
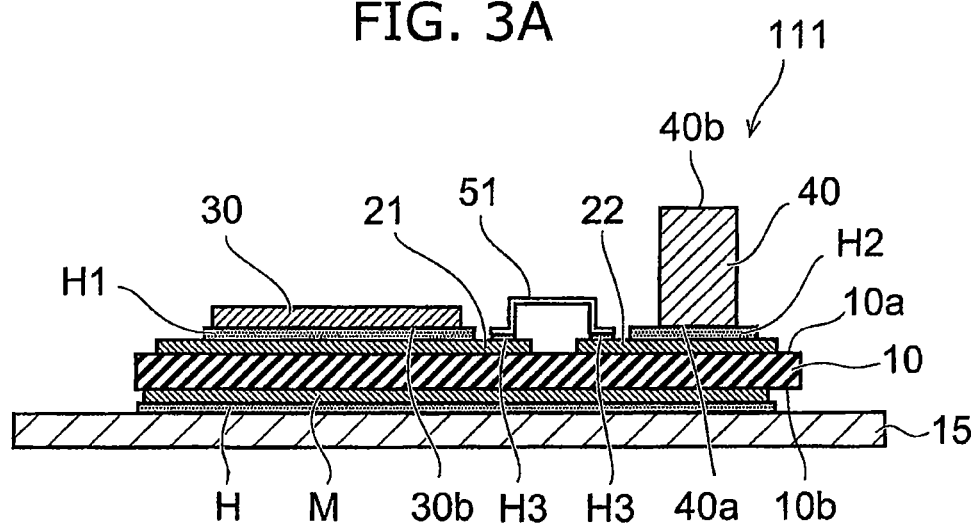

FIGS. 3A and 3B are exemplary diagrams explaining a semiconductor device according to another example of the first embodiment.

FIG. 3A is an exemplary perspective view of the semiconductor device 111 according to the embodiment and FIG. 3B is an exemplary cross-sectional view taken along the C-C' line shown in FIG. 3A.

The semiconductor device 111 is provided with an insulating substrate 10, a first electrode pattern 21, a second electrode pattern 22, a semiconductor element 30, an electrode terminal 40, and a connection wiring 51.

The connection wiring 51 is a wiring accommodated to a current for power application, and a bus bar is used for this connection wiring 51, for example. The connection wiring 51 is disposed so as to extend across the first electrode pattern 21 and the second electrode pattern 22. One end of the connection wiring 51 is connected to the first electrode pattern 21 and the other end is connected to the second electrode pattern 22.

The connection wiring 51 is connected to each of the first electrode pattern 21 and the second electrode pattern 22 with a solder H3.

The connection wiring 51 has a larger thermal resistance than the thermal resistance of the first electrode pattern 21. Al (aluminum) or Fe (iron) is used for the connection wiring 51, for example. As a result, the connection wiring 51 provided between the first electrode pattern 21 and the second electrode pattern 22 provides the thermal resistance of a heat conduction path from the first electrode pattern 21 to the second electrode pattern 22. Accordingly, the heat conduction from the first electrode pattern 21 to the second electrode pattern 22 is suppressed.

Second Embodiment

Figure 4A:
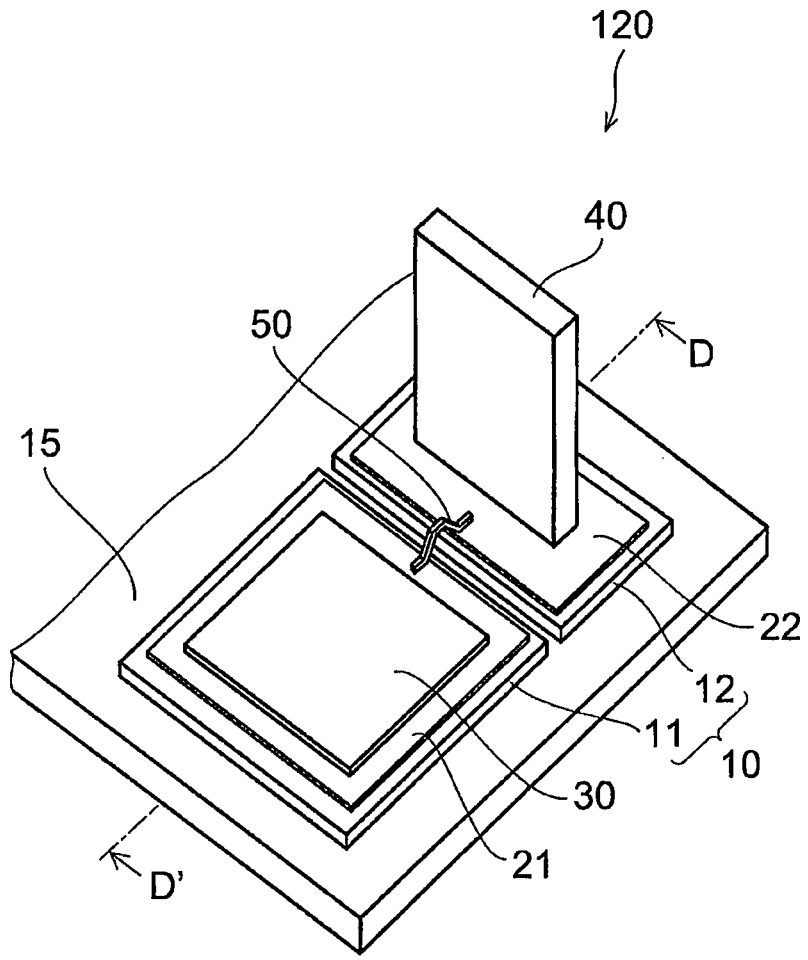
FIGS. 4A and 4B are exemplary diagrams explaining a semiconductor device according to a second embodiment.
Figure 4B:
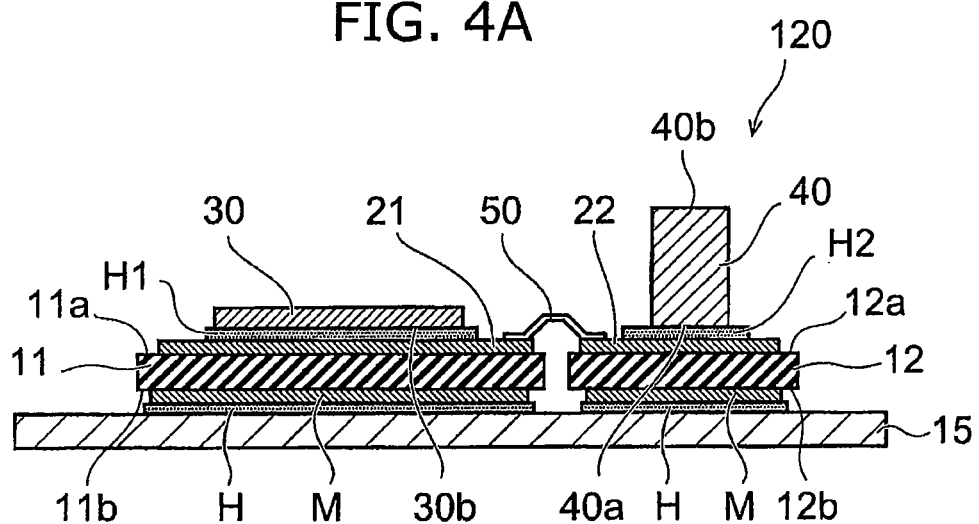

FIGS. 4A and 4B are exemplary diagrams explaining a semiconductor device according to a second embodiment.

FIG. 4A is an exemplary perspective view of the semiconductor device 120 according to the embodiment, and FIG. 4B is an exemplary cross-sectional view taken along the D-D' line shown in FIG. 4A.

The semiconductor device 120 is provided with an insulating substrate 10, a first electrode pattern 21, a second electrode pattern 22, a semiconductor element 30, an electrode terminal 40, and a connection wiring 50.

In the semiconductor device 120 according to the second embodiment, the insulating substrate 10 includes a first insulating substrate 11 and a second insulating substrate 12 apart from the first insulating substrate 11. A first major surface 11a of the first insulating substrate 11 is provided with the first electrode pattern 21. Further, a first major surface 12a of the second insulating substrate 12 is provided with the second electrode pattern 22.

The first insulating substrate 11 is connected to a base plate 15, for example. A metal film M is provided for a second major surface 11b of the first insulating substrate 11, and this metal film M and the base plate 15 are connected with each other with a solder H. The second insulating substrate 12 is also connected similarly to the base plate 15, for example. A second major surface 12b of the second insulating substrate 12 is provided with a metal film M, and this metal film M and the base plate 15 are connected with each other with a solder H.

The semiconductor element 30 is connected to the first electrode pattern 21 on the first insulating substrate 11 with a solder H1. Further, the electrode terminal 40 is connected to the second electrode pattern 22 on the second insulating substrate 12 with a solder H2.

The connection wiring 50 is a metal wiring electrically connecting the first electrode pattern 21 and the second electrode pattern 22 with each other. A bonding wire is used for the connection wiring 50, for example. The connection wiring 50 has a thermal resistance larger than that of the first electrode pattern 21.

In the semiconductor device 120, the first electrode pattern 21 and the second electrode pattern 22 are provided apart from each other. As a result, heat is not conducted directly from the first electrode pattern 21 to the second electrode pattern 22. Accordingly, in comparison with the case in which the first electrode pattern 21 and the second electrode pattern 22 are connected directly, the heat conduction is configured to be suppressed by the thermal resistance of the connection wiring 50.

Furthermore, in the semiconductor device 120, the insulating substrate 10 is divided into the first insulating substrate 11 and the second insulating substrate 12 and provided apart from each other. As a result, the heat is not conducted directly from the first electrode pattern 21 to the second electrode pattern 22 via the insulating substrate 10. Accordingly, in comparison with the case in which the insulating substrate 10 is not divided, the heat conduction is configured to be suppressed from the first electrode pattern 21 to the second electrode pattern 22 via the insulating substrate 10.

Another Example of the Second Embodiment

Figure 5A:
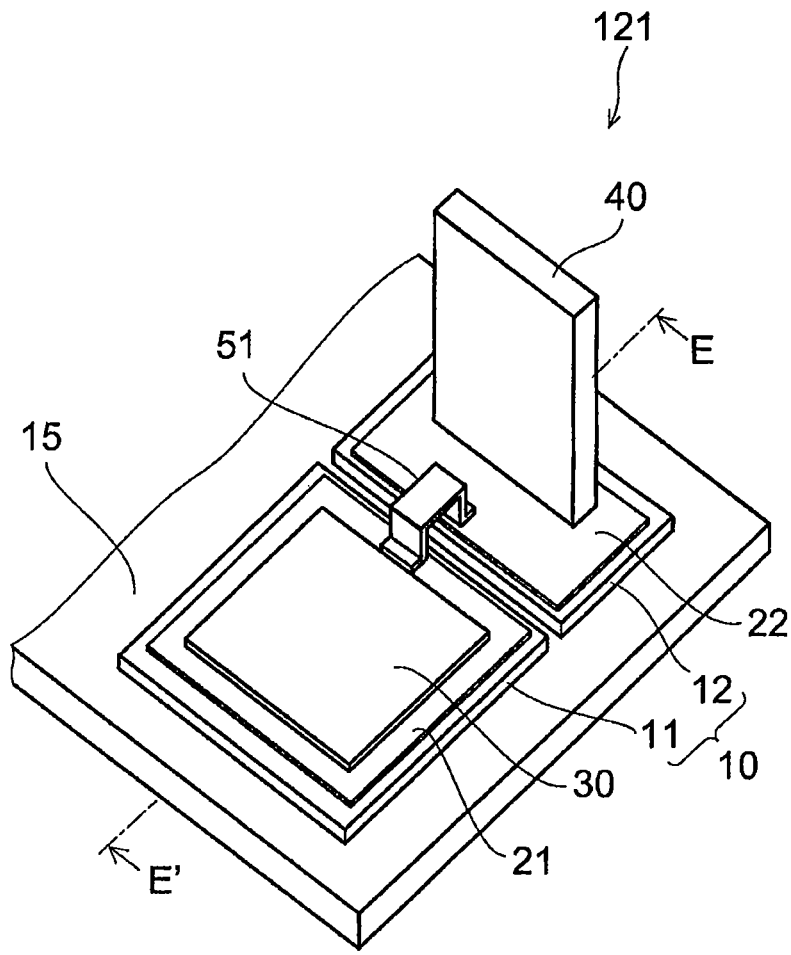
FIGS. 5A and 5B are exemplary diagrams explaining a semiconductor device according to another example of the second embodiment.
Figure 5B:
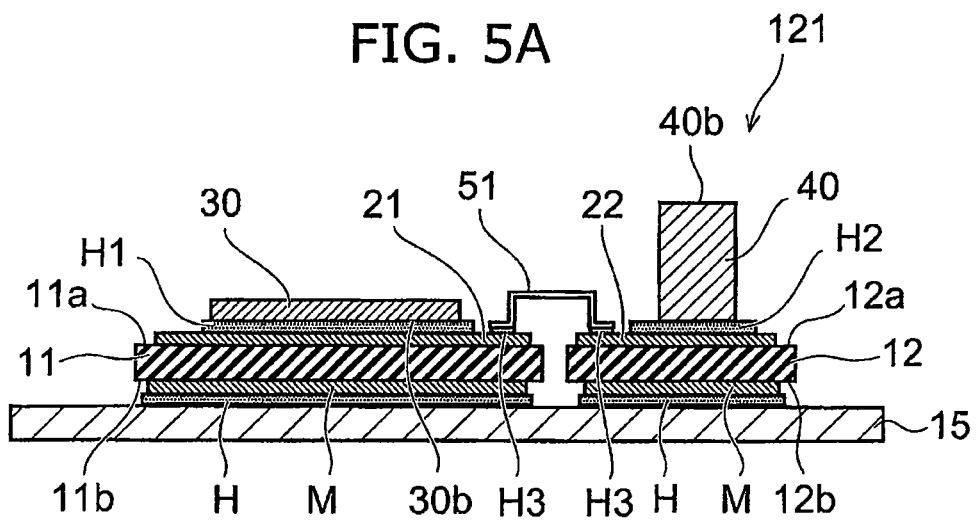

FIGS. 5A and 5B are exemplary diagrams explaining a semiconductor device according to another example of the second embodiment.

FIG. 5A is an exemplary perspective view of the semiconductor device 121 according to the embodiment, and FIG. 5B is an exemplary cross-sectional view taken along the E-E' line shown in FIG. 5A.

The semiconductor device 121 is provided with an insulating substrate 10, a first electrode pattern 21, a second electrode pattern 22, a semiconductor element 30, an electrode terminal 40, and a connection wiring 51.

In the semiconductor device 121 according to the second embodiment, the insulating substrate 10 includes a first insulating substrate 11 and a second insulating substrate 12. A first major surface 11a of the first insulating substrate 11 is provided with the first electrode pattern 21. Furthermore, a first major surface 12a of the second insulating substrate 12 is provided with the second electrode pattern 22.

The connection wiring 51 is a wiring accommodated to a current for power application, and a bus bar is used for this connection wiring 51, for example. The connection wiring 51 is provided so as to extend across the first electrode pattern 21 and the second electrode pattern 22. One end of the connection wiring 51 is connected to the first electrode pattern 21 on the first insulating substrate 11 and the other end is connected to the second electrode pattern 22 on the second insulating substrate 12. The connection wiring 51 is connected to each of the first electrode pattern 21 and the second electrode pattern 22 with a solder H3.

The connection wiring 51 has a larger thermal resistance than that of the first electrode pattern 21. Al (aluminum) or Fe (iron) is used for the connection wiring 51, for example. As a result, the connection wiring 51 provided between the first electrode pattern 21 and the second electrode pattern 22 provides the thermal resistance of a heat conduction path from the first electrode pattern 21 to the second electrode pattern 22. Accordingly, the heat conduction is suppressed from the first electrode pattern 21 to the second electrode pattern 22.

Furthermore, in the semiconductor device 120, the insulating substrate 10 is divided into the first insulating substrate 11 and the second insulating substrate 12 and provided apart from each other. As a result, the heat is not conducted directly from the first electrode pattern 21 to the second electrode pattern 22 via the insulating substrate 10. Accordingly, in comparison with the case in which the insulating substrate 10 is not divided, the heat conduction is configured to be suppressed from the first electrode pattern 21 to the second electrode pattern 22 via the insulating substrate 10.

Third Embodiment

Figure 6A:
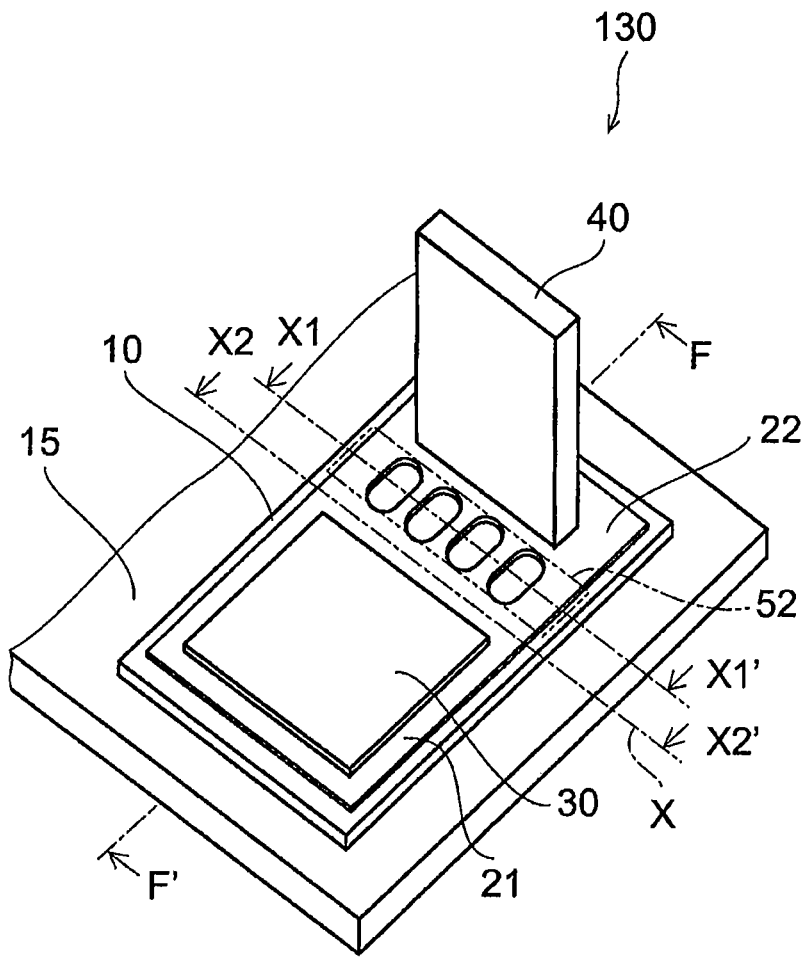
FIGS. 6A and 6B are exemplary diagrams explaining a semiconductor device according to a third embodiment.
Figure 6B:
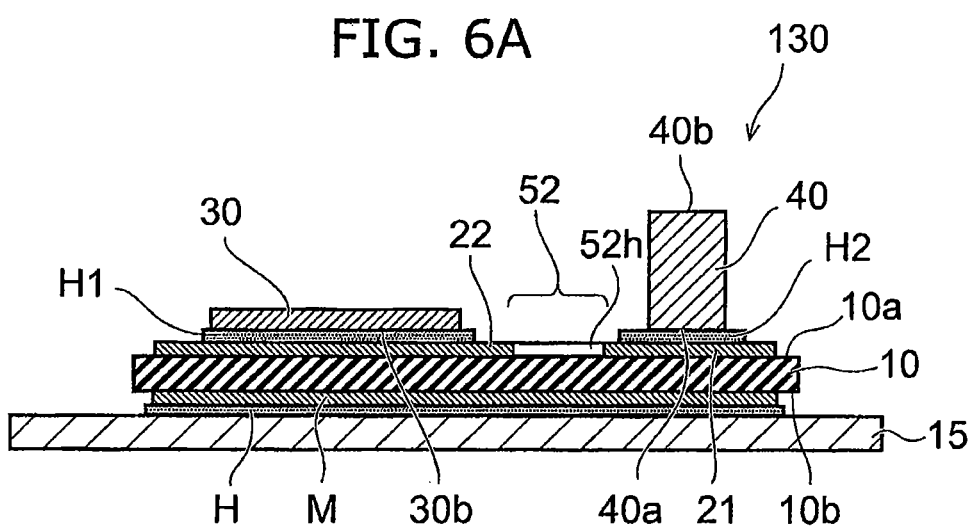

FIGS. 6A and 6B are exemplary diagrams explaining a semiconductor device according to a third embodiment.

FIG. 6A is an exemplary perspective view of the semiconductor device 130 according to the embodiment, and FIG. 6B is an exemplary cross-sectional view taken along the F-F' line shown in FIG. 6A.

The semiconductor device 130 is provided with an insulating substrate 10, a first electrode pattern 21, a second electrode pattern 22, a semiconductor element 30, an electrode terminal 40, and a connection wiring 52.

The connection wiring 52 is made of the same material as the first electrode pattern 21 and the second electrode pattern 22 and provided integrally. Here, a direction perpendicularly crossing a direction from the first electrode pattern 21 to the second electrode pattern 22 is defined as a first direction X.

Figure 7A:
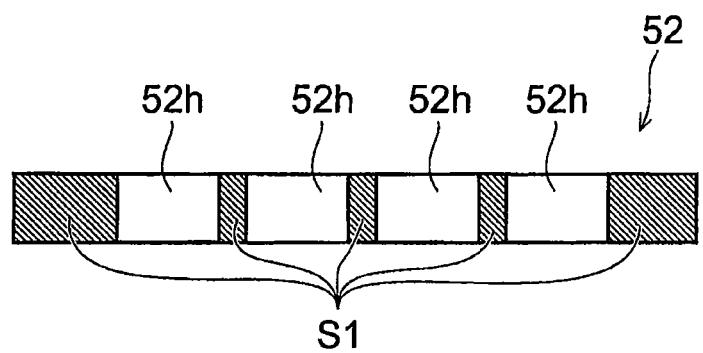
FIGS. 7A and 7B are exemplary cross-sectional views explaining a cross section along the first direction in the semiconductor device according to the third embodiment.
Figure 7B:
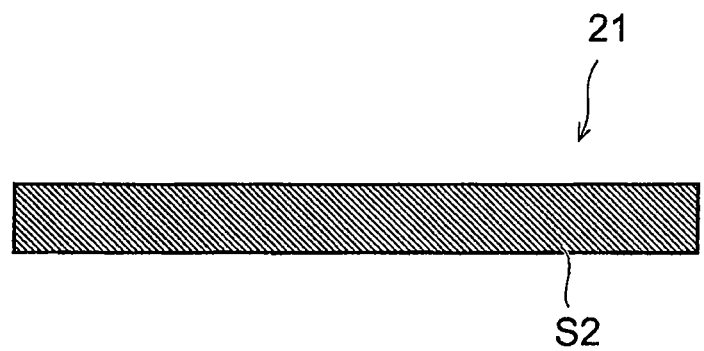

FIGS. 7A and 7B are exemplary cross-sectional views explaining a cross section along the first direction in the semiconductor device according to the third embodiment.

FIG. 7A is an exemplary cross-sectional view taken along the X1-X1' line shown in FIG. 6A, and FIG. 7B is an exemplary cross-sectional view taken along the X2-X2' line shown in FIG. 6A.

That is, FIG. 7A exemplarily shows a cross section of the connection wiring 52 along the first direction X. Furthermore, FIG. 7B exemplarily shows a cross section of the first electrode pattern 21 along the first direction X.

The connection wiring 52 includes a hole 52h at a part thereof. As a result, the area S1 of the cross section in the connection wiring 52 along the first direction X (refer to FIG. 7A) is smaller than the area S2 of the cross section in the first electrode pattern 21 along the first direction X (refer to FIG. 7B). Since the area S1 is smaller than the area S2, the thermal resistance of the connection wiring 52 becomes larger than that of the first electrode pattern 21 although the same material is used. The thermal resistance of the connection wiring 52 becomes larger as the area S1 becomes smaller. Accordingly, the thermal resistance is set to have a desired value when the area S1 is adjusted by the size of the hole 52h or the number of the holes 52h.

In the semiconductor device 130, the connection wiring 52 provided between the first electrode pattern 21 and the second electrode pattern 22 provides the thermal resistance of a heat conduction path from the first electrode pattern 21 to the second electrode pattern 22. As a result, the heat conduction from the first electrode pattern 21 to the second electrode pattern 22 is suppressed.

Note that, in the connection wiring 52 illustrated in FIGS. 6A and 6B, while the area S1 is adjusted by the hole 52 provided at a part thereof, the area S1 may be adjusted by a length (width) along the first direction X. That is, the width of the connection wiring 52 may be made narrower than the width of the first electrode pattern 21. In the case of the same thickness, the thermal resistance of the connection wiring 52 becomes larger as the width is made narrower.

Fourth Embodiment

Figure 8:
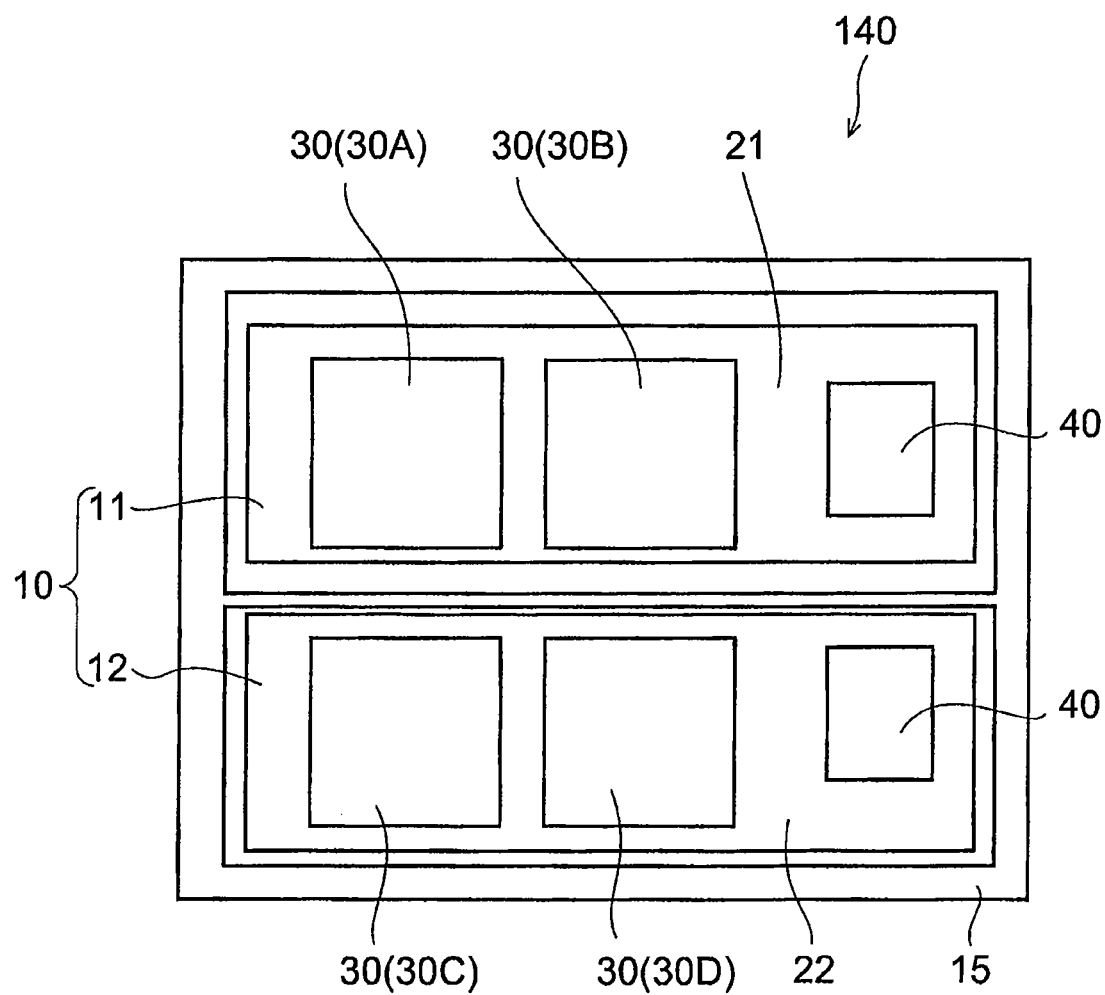
FIG. 8 is an exemplary plan view explaining a semiconductor device according to a fourth embodiment.

FIG. 8 is an exemplary plan view explaining a semiconductor device according to a fourth embodiment.

The semiconductor device 140 according to the fourth embodiment is provided with a plurality of semiconductor elements 30 (30A to 30D).

As shown in FIG. 8, the semiconductor device 140 is provided with an insulating substrate 10, a first electrode pattern 21, a second electrode pattern 22, and the plurality of semiconductor elements 30 (30A to 30D).

The semiconductor device 140 illustrated in FIG. 8, while being provided with the four semiconductor elements 30A to 30D, may be provided with two or more semiconductor elements 30 which have respective operation periods overlapping with one another at least in a part thereof.

Here, the semiconductor element 30A and the semiconductor element 30C have the respective operation periods overlapping with each other at least in a part thereof. Furthermore, the respective operation periods of the semiconductor element 30B and the semiconductor element 30D overlap with each other at least in a part thereof. In contrast, the semiconductor element 30A and the semiconductor element 30B have the respective operation periods different from each other. Further, the respective operation periods of the semiconductor element 30C and the semiconductor element 30D are different from each other.

The insulating substrate 10 includes a first insulating substrate 11 and a second insulating substrate 12 which is provided apart from the first insulating substrate 11.

The semiconductor elements 30A and 30B having the respective operation periods different from each other are connected to the first electrode pattern 21 provided on the first insulating substrate 11. Further, the semiconductor element 30C and the semiconductor element 30D having the respective operation periods different from each other are connected to the second electrode pattern 22 provided on the second insulating substrate 12.

In contrast, the semiconductor elements 30A and 30C having the respective operation periods which overlap with each other at least in a part thereof are connected to the different substrates 10 (first insulating substrate 11 and second insulating substrate 12), respectively. Furthermore, the semiconductor elements 30B and 30D having the respective operation periods which overlap with each other at least in a part thereof are connected to the different substrates 10 (first insulating substrate 11 and second insulating substrate 12), respectively.

Here, when the semiconductor elements 30A and 30C or 30b and 30D having the respective operation periods which overlap with each other at least in a part thereof neighbor each other, heat concentration tends to occur between these elements.

Figure 9:
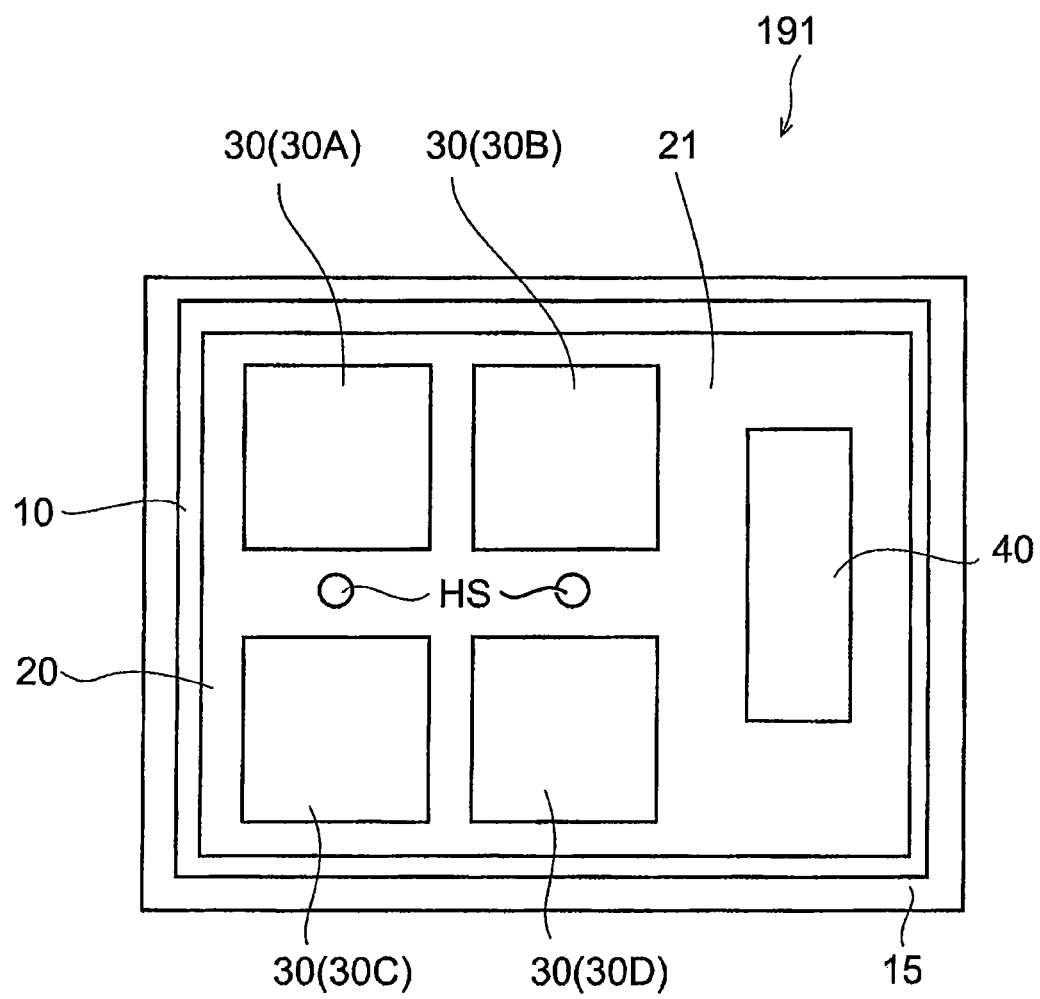
FIG. 9 is an exemplary plan view explaining the heat concentration between the elements.

FIG. 9 is an exemplary plan view explaining the heat concentration between the elements.

In a semiconductor device 191 shown in FIG. 9, four semiconductor elements 30 (30a to 30D) are connected to an electrode pattern 20 provided on a single insulating substrate 10. In this case, between the semiconductor elements 30A and 30C or the semiconductor elements 30B and 30D which are operated at the same timing, the heat is conducted through the electrode pattern 20 and the insulating substrate 10 from both of the semiconductor elements and the heat concentration tends to occur in a region HS between the semiconductor elements.

In the semiconductor device 140, the semiconductor elements 30A and 30C or the semiconductor elements 30B and 30D, which have the respective operation periods overlapping with each other at least in a part thereof, are connected to the insulating substrates 10 different from each other (first insulating substrate 11 and second insulating substrate 12), respectively. Accordingly, the heat generated in each of the semiconductor elements 30A and 30C or the semiconductor element 30B and 30D which are operated at the same timing is not directly conducted to the neighboring insulating substrate (second insulating substrate 12 or first insulating substrate 11). As a result, the heat concentration between the elements is suppressed.

Note that, while the semiconductor element 30 and the electrode terminal 40 are connected to the same electrode pattern in the semiconductor device 140, the semiconductor element 30 and the electrode terminal 40 may be connected to the different electrode patterns, respectively, and a connection wiring 50 or 51 may be provided between the electrode patterns, as in the semiconductor device 110 or 111.

In addition, in the semiconductor device 140, the semiconductor element 30 and the electrode terminal 40 may be provided for different insulating substrates, respectively, as in the semiconductor device 120 and 121.

Further, in the semiconductor device 140, a connection wiring 52 having a smaller cross-sectional area than the first electrode pattern 21 may be provided between the first electrode pattern 21 and the second electrode patter 22 as in the semiconductor device 130.

Here, an IGBT is used for the semiconductor elements 30A and 30C, for example. Furthermore, an FRD (Fast Recovery Diode) is used for the semiconductor elements 30B and 30D, for example. The IGBT and the FRD have respective operation periods different from each other, and thus are mounted on the same insulating substrate. In contrast, a plurality of IGBTs or a plurality of FRDs sometimes have the respective operation periods which overlap with each other at least in a part thereof and thus are mounted on the insulating substrates different from each other, respectively, from the viewpoint of the heat concentration suppression between the elements.

Another Example of the Fourth Embodiment

Figure 10:
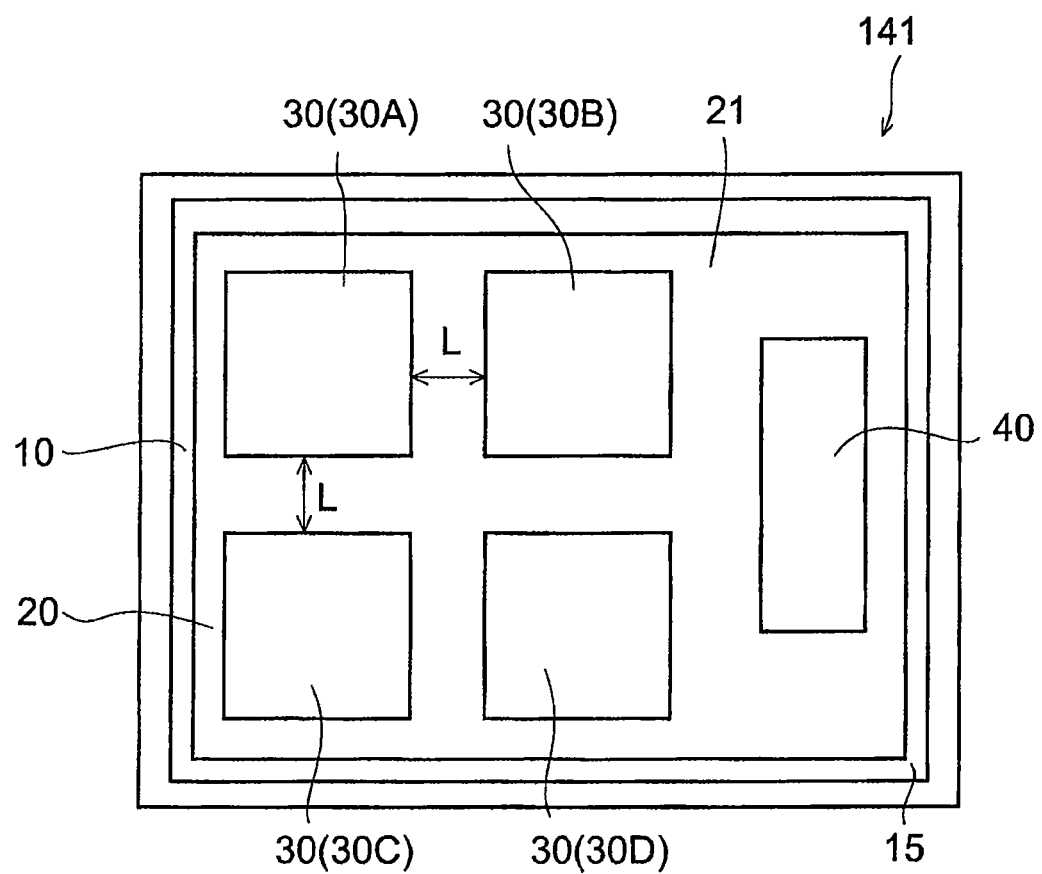
FIG. 10 is an exemplary plan view explaining a semiconductor device according to another example of the fourth embodiment.

FIG. 10 is an exemplary plan view explaining a semiconductor device according to another example of the fourth embodiment.

The semiconductor device 141 according to another example of the fourth embodiment is provided with a plurality of semiconductor elements 30 (30A to 30D).

As shown in FIG. 10, the semiconductor device 141 is provided with an insulating substrate 10, an electrode pattern 20, and the plurality of semiconductor elements 30 (30A to 30D).

The semiconductor device 141 illustrated in FIG. 10, while being provided with the four semiconductor devices 30A to 30D, may be provided with two or more semiconductor devices 30.

In this semiconductor device 141, a plurality of semiconductor elements 30 (30A to 30D) are connected to the electrode pattern 20 provided for the insulating substrate 10. In the semiconductor device 141 illustrated in FIG. 10, two of the semiconductor devices 30 are disposed in each of the horizontal and vertical directions. Such a disposition satisfies a condition, L>2D, when a spacing between the neighboring semiconductor elements 30 in each of the horizontal and vertical directions is denoted by L and the thickness of the substrate is denoted by D. Here, the thickness D of the substrate is the thickness of the substrates which form a heat dissipation route on the mount-surface (rear surface) side of the semiconductor element 30. For example, the thickness D is the thickness from the rear surface of the semiconductor element 30 to the second major surface 10b of the insulating substrate 10.

Figure 11A:
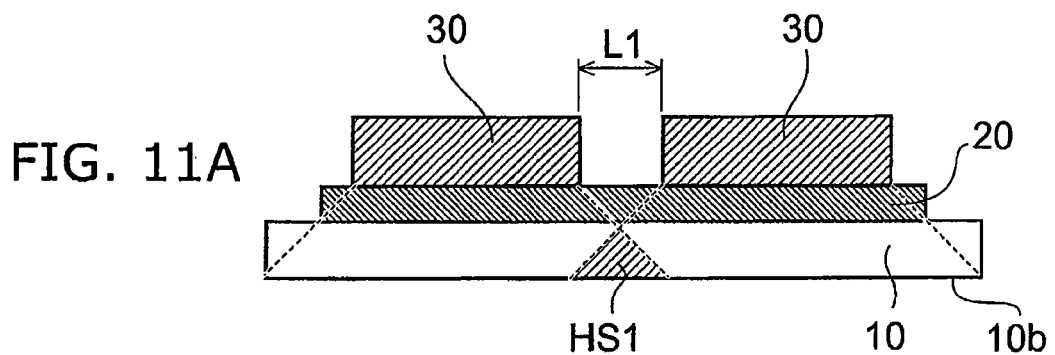
FIGS. 11A and 11B are exemplary cross-sectional views explaining a heat dissipation state corresponding to the spacing L.
Figure 11B:
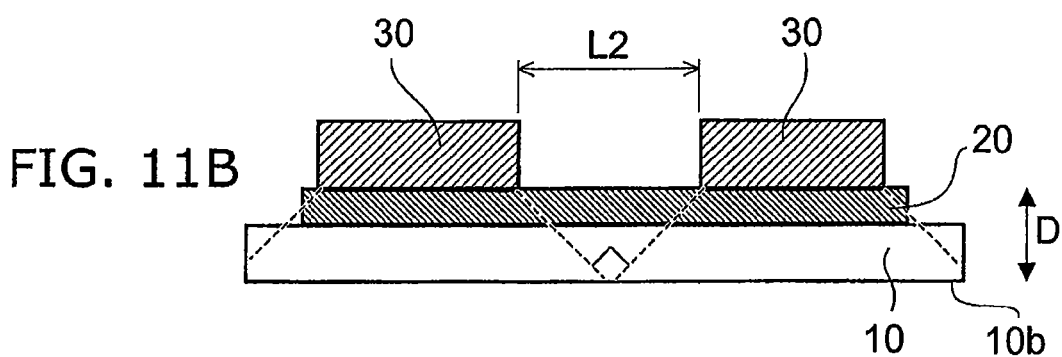

FIGS. 11A and 11B are exemplary cross-sectional views explaining a heat dissipation state corresponding to the spacing L.

FIG. 11A illustrates a heat dissipation route when a neighboring semiconductor element 30 is provided having a spacing L1. Furthermore, FIG. 11B illustrates a heat dissipation route when the neighboring semiconductor element 30 is provided having a spacing L2 which is wider than the spacing L1.

The semiconductor element 30 mounted on the substrate radiates heat as a heating element when operated. The heat dissipation route from the semiconductor element 30 to the insulating substrate 10 side is considered to spread obliquely at 45 degrees from the mount-surface (rear surface) of the semiconductor element 30.

Here, as shown in FIG. 11A, when the neighboring semiconductor element 30 is provided having the spacing L1, the heat dissipation routes, which spread respectively, overlap with each other between the rear surface of the semiconductor element 30 and the rear surface of the substrate. In contrast, as shown in FIG. 11B, when the neighboring semiconductor element 30 is provided having the spacing L2, the heat dissipation routes do not overlap with each other.

That is, when the condition, L>2D, is satisfied, the heat dissipation routes do not overlap with each other.

In the semiconductor device 141, a plurality of semiconductor elements 30 (30A to 30D) are disposed so as to satisfy the condition, L>2D, with respect to the spacing L between the neighboring semiconductor elements 30. As a result, between the neighboring semiconductor elements 30, the heat concentration caused by the heat generation on both sides is suppressed and the lowering of the connection reliability of the semiconductor element 30 is prevented.

Fifth Embodiment

Figure 12:
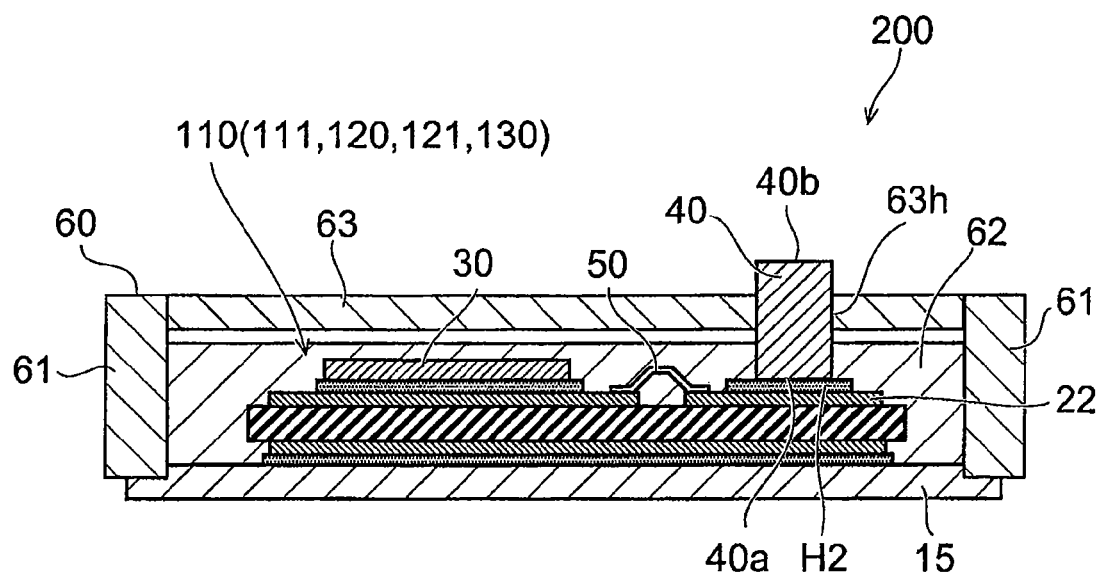
FIG. 12 is an exemplary cross-sectional view explaining a semiconductor unit according to a fifth embodiment.

FIG. 12 is an exemplary cross-sectional view explaining a semiconductor unit according to a fifth embodiment.

As shown in FIG. 12, the semiconductor unit 200 includes any of the above explained semiconductor devices 110, 111, 120, 121, and 130 within a package 60. The semiconductor unit 200 illustrated in FIG. 8 shows an example of accommodating the semiconductor device 110 according to the first embodiment within the package 60.

The package 60 is provided with a frame part 61, a sealing material 62, and a cover part 63. The frame part 61 is made of resin and provided so as to surround the base plate 15. The sealing material 62 is silicon resin, for example. The sealing material 62 is injected into the inside of the frame part 61. As a result, the part of the semiconductor device 110 except the other end 40b of the electrode terminal 40 is embedded in the sealing material 62 within the frame part 61. The cover part 63 is provided at an open end of the frame part 61. A hole 63h is provided at the cover part 63 for causing the electrode terminal 40 protruding from the sealing material 62 to pass through. The cover part 63 is attached to the frame part 62, and thus the other end 40b of the electrode terminal 40 is extended from the cover part 63 to the outside through this hole 63h.

With the single semiconductor unit 200 or a combination of a plurality of semiconductor units 200, a desired apparatus is configured. In the semiconductor unit 200 according to the embodiment, since any of the semiconductor devices 110, 111, 120, 121, and 130 is accommodated within the package 60, it is possible to inhibit the heat generated in the semiconductor element 30 from being conducted to the solder H2 connecting the electrode terminal 40. As a result, the lowering of the reliability in the connection by using a solder H2 between the electrode terminal 40 and the second electrode pattern 22 is prevented in the semiconductor unit 200.

Sixth Embodiment

Next, a power semiconductor device according to a sixth embodiment will be explained. In the power semiconductor device according to the embodiment, a power semiconductor element is used as the above explained semiconductor element 30, 110, 111, 120, 121, 130, 140, or 141. Furthermore, the above explained semiconductor unit 200 may be used for the power semiconductor device.

Figure 13:
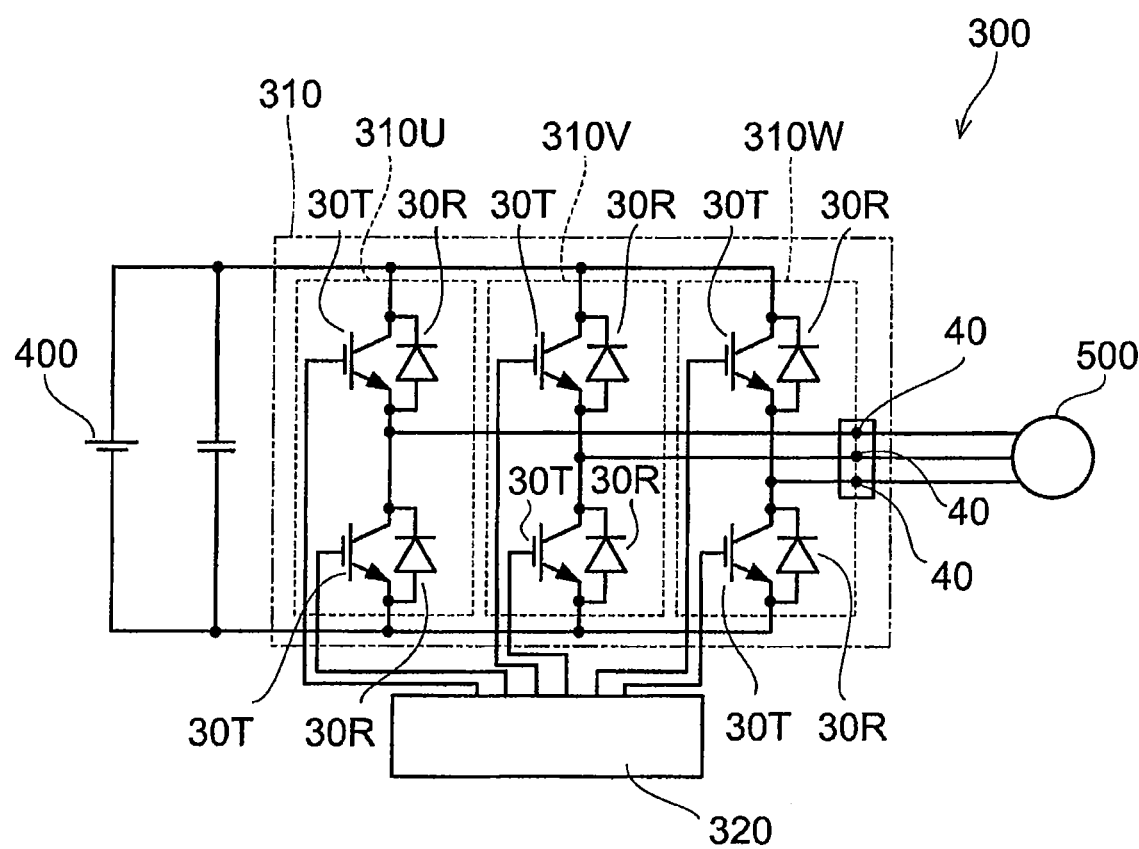
FIG. 13 is a circuit diagram explaining an example of the power semiconductor device.

FIG. 13 is a circuit diagram explaining an example of the power semiconductor device.

FIG. 13 illustrates a circuit of an inverter device as the power semiconductor device 300. The inverter device converts a DC voltage supplied from a DC power supply 400 into a three phase AC voltage of, for example, a U-phase, V-phase, and W-phase and outputs the three phase AC voltage. A motor 500 is used as an object load, for example.

The inverter device is provided with an inverter circuit 310 and a control part 320. For the inverter circuit 310, the above explained semiconductor device 110, 111, 120, 121, 130, 140, or 141 and the semiconductor unit 200 are used. In the inverter device shown in FIG. 13, three phase generation circuits 310U, 310V, and 310W are provided in response to the respective three phases.

Each of the phase generation circuits 310U, 310V, and 310W is provided with four semiconductor elements 30T and 30R. The semiconductor element 30T is a transistor such as an IGBT. The semiconductor element 30R is a diode such as a FRD. One combination of the semiconductor elements 30T and 30R is used for the upper arm of one phase. Furthermore, the other combination of the semiconductor elements 30T and 30R is used for the lower arm of one phase. A control signal is sent to each gate of the semiconductor elements 30T from the control part 320. The opening and closing in each of the semiconductor elements 30T is controlled by this control signal. As a result, an AC voltage corresponding to each phase is output from each of the phase generation circuits 310U, 310V, and 310W.

In the power semiconductor device 300 according to the embodiment, the heat concentration caused by the heat generation in the semiconductor elements 30T and 30R can be suppressed. Accordingly, there is provided the power semiconductor device 300 preventing the lowering of the connection reliability of the semiconductor elements 30T and 30R and the member provided therearound such as the electrode terminal 40.

The power semiconductor device 300 according to the embodiment can be applied to various kinds of circuit configuration such as a convertor device, a power transistor device, and a power diode device.

Hereinabove, exemplary embodiments of the invention are described with reference to specific examples. However, the invention is not limited to these specific examples. For example, various modifications made by one skilled in the art in regard to the configurations, sizes, material qualities, arrangements, etc., of components of semiconductor device, semiconductor unit, and power semiconductor device are included in the scope of the invention to the extent that the purport of the invention is included.

Further, any two or more components of the specific examples may be combined within the extent of technical feasibility; and are included in the scope of the invention to the extent that the purport of the invention is included.

Moreover, all semiconductor devices, semiconductor units, and power semiconductor devices practicable by an appropriate design modification by one skilled in the art based on the semiconductor light emitting devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
an insulating substrate;
a first electrode pattern and a second electrode pattern provided apart from each other on a major surface of the insulating substrate;
a first semiconductor element connected to the first electrode pattern;
a second semiconductor element connected to the first electrode pattern;
a third semiconductor element connected to the second electrode pattern;
a fourth semiconductor element connected to the second electrode pattern;
an electrode terminal connected to the second electrode pattern;
a connection wiring electrically connecting the first electrode pattern and the second electrode pattern to each other and having a thermal resistance larger than that of the first electrode pattern;
a first connection member connecting the first electrode pattern and the first semiconductor element to each other; and
a second connection member connecting the second electrode pattern and the electrode terminal to each other and having a melting point lower than that of the first connection member, wherein
the insulating substrate includes a first insulating substrate on which the first electrode pattern is provided and a second insulating substrate on which the second electrode pattern is provided, the second insulating substrate being provided apart from the first insulating substrate,
the first semiconductor element and the second semiconductor element each comprise a switching element respectively configured to be in a conducting state during different operating periods,
the third semiconductor element and the fourth semiconductor element each comprise a switching element respectively configured to be in a conducting state during different operating periods,
the first semiconductor element and the third semiconductor element each comprise a switching element respectively configured to be in a conducting state during operating periods which overlap with each other at least in a part thereof, and
the second semiconductor element and the fourth semiconductor element each comprise a switching element respectively configured to be in a conducting state during operating periods which overlap with each other at least in a part thereof.

2. The device according to claim 1, wherein
a melting point of the first connection member is higher than an operating temperature of the first semiconductor element.

3. The device according to claim 1, wherein
an area of a cross section in the connection wiring along a first direction is smaller than an area of a cross section in the first electrode pattern along the first direction, the first direction being a direction perpendicular to a direction extending from the first electrode pattern towards the second electrode pattern.

4. The device according to claim 3, wherein
the connection wiring is provided with a hole.

5. The device according to claim 3, wherein
a width of the connection wiring along the first direction is narrower than a width of the first electrode pattern along the first direction.

6. The device according to claim 1, wherein
a material of the connection wiring is different from a material of the first electrode pattern.

7. The device according to claim 1, wherein
a material of the connection wiring is the same as a material of the first electrode pattern.

8. The device according to claim 1, comprising
a plurality of semiconductor elements, wherein
a condition, L>2D, is satisfied, where L is a spacing width between the plurality of semiconductor elements along the major surface and D is a distance from a surface of each semiconductor element that is facing the major surface to a surface of the insulating substrate that is opposite the major surface.

9. The device according to claim 1, wherein
a bonding wire is used as the connection wiring.

10. The device according to claim 1, wherein
a bus bar is used as the connection wiring.

11. The device according to claim 1, wherein
a ceramic substrate is used as the insulating substrate.

12. The device according to claim 1, wherein
copper is used as the first electrode pattern and the second electrode pattern, and
aluminum is used as the connection wiring.

13. The semiconductor device of claim 1, wherein the first through fourth semiconductor elements are disposed in an array such that the first and third semiconductor elements are adjacent to each other in a first direction, the second and fourth semiconductor elements are adjacent to each other in the first direction, the first and second semiconductor are adjacent to each other in a second direction crossing the first direction, and the third and fourth semiconductor elements are adjacent to each other in the second direction.

14. The semiconductor device of claim 13, wherein the first and third semiconductor elements are insulated gate bipolar transistors and the second and fourth semiconductor elements are fast recovery diodes.

15. The semiconductor device of claim 1, further comprising:
a control unit configured to control the conducting state of the first and third semiconductor elements to each be in an ON state during respective operating periods which at least partly overlap with each other, wherein
the second and fourth semiconductor elements are each diodes reverse-connected with respect to an ON state conductance path of the first and third semiconductor elements, respectively.

16. A semiconductor unit, comprising:
a semiconductor device including:
an insulating substrate;
a first electrode pattern and a second electrode pattern provided apart from each other on a major surface of the insulating substrate;
a first semiconductor element connected to the first electrode pattern;

a second semiconductor element connected to the first electrode pattern;
a third semiconductor element connected to the second electrode pattern;
a fourth semiconductor element connected to the second electrode pattern;
an electrode terminal connected to the second electrode pattern;
a connection wiring electrically connecting the first electrode pattern and the second electrode pattern with each other and having a thermal resistance larger than that of the first electrode pattern;
a first connection member connecting the first electrode pattern and the first semiconductor element to each other;
a second connection member connecting the second electrode pattern and the electrode terminal to each other and having a melting point lower than that of the first connection member; and
a package accommodating therein at least the first semiconductor element, the connection wiring, and a part of the electrode terminal, wherein
the insulating substrate includes a first insulating substrate on which the first electrode pattern is provided and a second insulating substrate on which the second electrode pattern is provided, the second insulating substrate being provided apart from the first insulating substrate,
the first semiconductor element and the second semiconductor element each comprise a switching element respectively configured to be in a conducting state during different operating periods,
the third semiconductor element and the fourth semiconductor element each comprise a switching element respectively configured to be in a conducting state during different operating periods,
the first semiconductor element and the third semiconductor element each comprise a switching element respectively configured to be in a conducting state during operating periods which overlap with each other at least in a part thereof, and
the second semiconductor element and the fourth semiconductor element each comprise a switching element respectively configured to be in a conducting state during operating periods which overlap with each other at least in a part thereof.

17. A power semiconductor device, comprising;
an insulating substrate;
a first electrode pattern and a second electrode pattern provided apart from each other on a major surface of the insulating substrate;
a first power semiconductor element connected to the first electrode pattern;
a second power semiconductor element connected to the first electrode pattern;
a third power semiconductor element connected to the second electrode pattern;
a fourth power semiconductor element connected to the second electrode pattern;
an electrode terminal connected to the second electrode pattern;
a connection wiring electrically connecting the first electrode pattern to the second electrode pattern and having a thermal resistance larger than a thermal resistance of the first electrode pattern;
a first connection member connecting the first electrode pattern to the first power semiconductor element; and
a second connection member connecting the second electrode pattern to the electrode terminal and having a melting point lower than that of the first connection member, wherein
the insulating substrate includes a first insulating substrate on which the first electrode pattern is provided and a second insulating substrate on which the second electrode pattern is provided, the second insulating substrate being provided apart from the first insulating substrate,
the first power semiconductor element and the second power semiconductor element each comprise a switching element respectively configured to be in a conducting state during different operating periods,
the third power semiconductor element and the fourth power semiconductor element each comprise a switching element respectively configured to be in a conducting state during different operating periods,
the first power semiconductor element and the third power semiconductor element each comprise a switching element respectively configured to be in a conducting state during operating periods which overlap with each other at least in a part thereof, and
the second power semiconductor element and the fourth power semiconductor element each comprise a switching element respectively configured to be in a conducting state during operating periods which overlap with each other at least in a part thereof.

18. The power semiconductor device of claim 17, wherein the first connection member also connects the first electrode pattern to the second power semiconductor element.

19. The power semiconductor device of claim 17, wherein the first power semiconductor element includes an insulated gate bipolar transistor.

* * * * *